(12) United States Patent
Gai

(10) Patent No.: US 7,446,397 B2
(45) Date of Patent: *Nov. 4, 2008

(54) LEADLESS SEMICONDUCTOR PACKAGE

(75) Inventor: Yung-Feng Gai, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 173 days.

This patent is subject to a terminal disclaimer.

(21) Appl. No.: 11/495,723

(22) Filed: Jul. 31, 2006

(65) Prior Publication Data

US 2006/0278961 A1 Dec. 14, 2006

Related U.S. Application Data

(63) Continuation-in-part of application No. 10/901,090, filed on Jul. 29, 2004, now Pat. No. 7,145,222.

(30) Foreign Application Priority Data

Aug. 25, 2003 (TW) ............................... 92123336 A

(51) Int. Cl.
*H01L 23/495* (2006.01)
(52) U.S. Cl. ................ 257/667; 257/676; 257/E23.037
(58) Field of Classification Search ................ 257/667, 257/676, 684, 690, 698, 783, E23.031, E23.037, 257/E23.04, E23.124; 438/123
See application file for complete search history.

(56) References Cited

U.S. PATENT DOCUMENTS

| 6,303,985 | B1 | 10/2001 | Larson et al. | 257/676 |
| 6,585,905 | B1 | 7/2003 | Fan et al. | 216/14 |
| 6,661,083 | B2 | 12/2003 | Lee et al. | 257/676 |
| 6,809,408 | B2 * | 10/2004 | Yu et al. | 257/676 |
| 7,145,222 | B2 * | 12/2006 | Gai | 257/667 |
| 2004/0217450 | A1 | 11/2004 | Li et al. | 257/666 |

* cited by examiner

*Primary Examiner*—Quoc D Hoang
(74) *Attorney, Agent, or Firm*—Bacon & Thomas PLLC

(57) ABSTRACT

A leadless semiconductor package includes a lead frame, an adhesive, a chip, a plurality of first electrically conductive wires and a plurality of second electrically conductive wires. In this case, the lead frame has a chip paddle, a plurality of leads surrounding the chip paddle. The chip paddle has a cavity and a grounding area surrounding the cavity. The cavity has an opening, a bottom and a through hole, and the bottom is larger than the opening in size. The adhesive is disposed in the cavity. The chip have an active surface and a back surface opposed to the active surface, and the back surface is disposed in the cavity and is attached to the lead frame through the adhesive. The first electrically conductive wires electrically connect the leads and the chip. The second electrically conductive wires electrically connect the grounding area and the chip.

19 Claims, 5 Drawing Sheets

US 7,446,397 B2

LEADLESS SEMICONDUCTOR PACKAGE

CROSS-REFERENCE TO RELATED APPLICATION

The present application is a continuation-in-part (CIP) of U.S. patent application Ser. No. 10/901,090 filed on Jul. 29, 2004 which in turn claims the priority of Taiwan Patent Application No. 092123336 filed on Aug. 25, 2003.

FIELD OF INVENTION

This invention relates to a leadless semiconductor package. More particularly, the present invention is related to a leadless semiconductor package with high reliability of the attachment of the chip to the leadless lead-frame.

RELATED ART

Integrated circuits (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits. Nowadays, ball grid array package (BGA) and chip scale package (CSP) are wildly applied to chip package with high I/Os and assembly package for thermal enhance integrated circuits.

However, assembly package with lead frame possesses great marketing for that it can provide low-cost solutions for current semiconductor package. Due to lead frame with long inner leads and outer leads, such conventional lead-frame assembly package can not apply to chip scale package and low profile package. Thus leadless assembly package, such as Quad-Flat-Non-lead Package which is initially developed by Matsushita, is wildly provided in the semiconductor package industry to reduce the size of the assembly package in the recent years. Referring to FIG. 1, a conventional leadless assembly package is disclosed. The leadless semiconductor package 100 mainly comprises a leadless lead-frame 110, such as a copper lead-frame, a chip 120, an adhesive 130, a plurality of conductive wires 140 and an encapsulation 150. Therein, the leadless lead-frame 110 has a chip paddle 112 and a plurality of leads 114 surrounding the chip paddle 112; and the chip paddle 112 comprises a chip disposal area 112a and a grounding area 112b; and the chip 120 is disposed above the chip disposal area 112a through an adhesive 130, such as silver paste, connecting the back surface 122 of the chip 120 and the chip disposal area 112a. Moreover, the chip 120 further has an active surface 124 and a plurality of bonding pads 126 formed on the active surface 124; and the chip 120 is electrically connected to the top 114a of the lead 114 and the grounding area 112b of the chip paddle 112 through the conductive wires 140, such as gold wires. And the encapsulation 150, such as molding compound, encapsulates the leadless lead-frame 110, the chip 120 and the conductive wires 130 and exposes the bottom 112c of the chip pad 112 and the bottom 114b of the leads 114 so as to form a plurality of electrical terminals to connect to external electronic devices through surface mount technology (SMT).

As mentioned above, the chip paddle 112 of said leadless semiconductor package 100 exposes the bottom 112c and 114b of the leadless semiconductor package 100 so as to further enhance the thermal performance of said leadless semiconductor package. Furthermore, due to the short leads, the impedance will be lower. Accordingly, the leadless semiconductor package is especially adapted to the assembly package with high-frequency devices, which are performed at the frequency from 10 GHz to 100 GHz, enclosed therein. In such a manner, such leadless semiconductor package has low cost and competitive price. Therefore the leadless semiconductor package is adapted to cell phone, personal digital application (PDA), digital camera and information application (IA).

As can be seen, an adhesive 130 is interposed between the chip disposal area 112a of the chip paddle 112 and the back surface 122 of the chip 120 to have the chip 120 securely attached to the chip paddle 112. However, when the adhesive 130 is an epoxy resin or a silver paste and the size of the chip 120 is slightly smaller than the size of the chip paddle 112, the adhesive 130 is easily to flash over and flow over the grounding area 112b. Specifically, when the distance between the periphery 128 of the chip 120 and the periphery of the chip paddle 112, namely the width D of the grounding area 112b, is not greater than six (6) mils, exceeding adhesive will more easily flash over and flow over the grounding area 112b so that the conductive wires 130 will not be well bonded to the grounding area 112b and the reliability of said package will be lowered.

Consequently, providing another leadless semiconductor package to solve the mentioned-above disadvantages is the most important task in this invention.

SUMMARY OF THE INVENTION

In view of the above-mentioned problems, this invention is to provide a leadless semiconductor package with high reliability of the attachment of the chip to the leadless lead-frame.

To achieve the above-mentioned, a leadless semiconductor package is provided, wherein the leadless semiconductor package includes a lead frame, an adhesive, a chip, a plurality of first electrically conductive wires and a plurality of second electrically conductive wires. In this case, the lead frame has a chip paddle, a plurality of leads surrounding the chip paddle. The chip paddle has a cavity and a grounding area surrounding the cavity. The cavity has an opening, a bottom and a through hole, and the bottom is larger than the opening in size. The adhesive is disposed in the cavity. The chip have an active surface and a back surface opposed to the active surface, and the back surface is disposed in the cavity and is attached to the lead frame through the adhesive. The first electrically conductive wires electrically connect the leads and the chip. The second electrically conductive wires electrically connect the grounding area and the chip. Besides, the cavity further has at least a concavity formed therein. Accordingly, when the chip is placed on the chip paddle through the adhesive, the contact area of the adhesive with the chip paddle will be increased to enhance the attachment of the chip to the chip paddle.

To achieve the above-mentioned, the invention is to provide a leadless lead-frame includes a chip paddle and a plurality of leads. In this case, the chip paddle has a cavity and a grounding area surrounding the cavity. The cavity further has a through hole, an opening, a bottom and a slot formed in the cavity, the bottom is larger than the opening in size. The leads surround the chip paddle.

As mentioned above, the grounding area is protruded from the chip paddle and disposed around the cavity, so as to prevent the adhesive from flowing into the grounding area and cause the adhesive well distributed in the cavity. In such a manner, the chip will be well bonded to the grounding area by the electrically conductive wires. Besides, the chip is placed in the cavity so that the total thickness of the package will become smaller. Accordingly, there is a thinner leadless semiconductor package provided.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The leadless semiconductor package according to the preferred embodiments of this invention will be described herein below with reference to the accompanying drawings, wherein the same reference numbers refer to the same elements.

Figure 1:
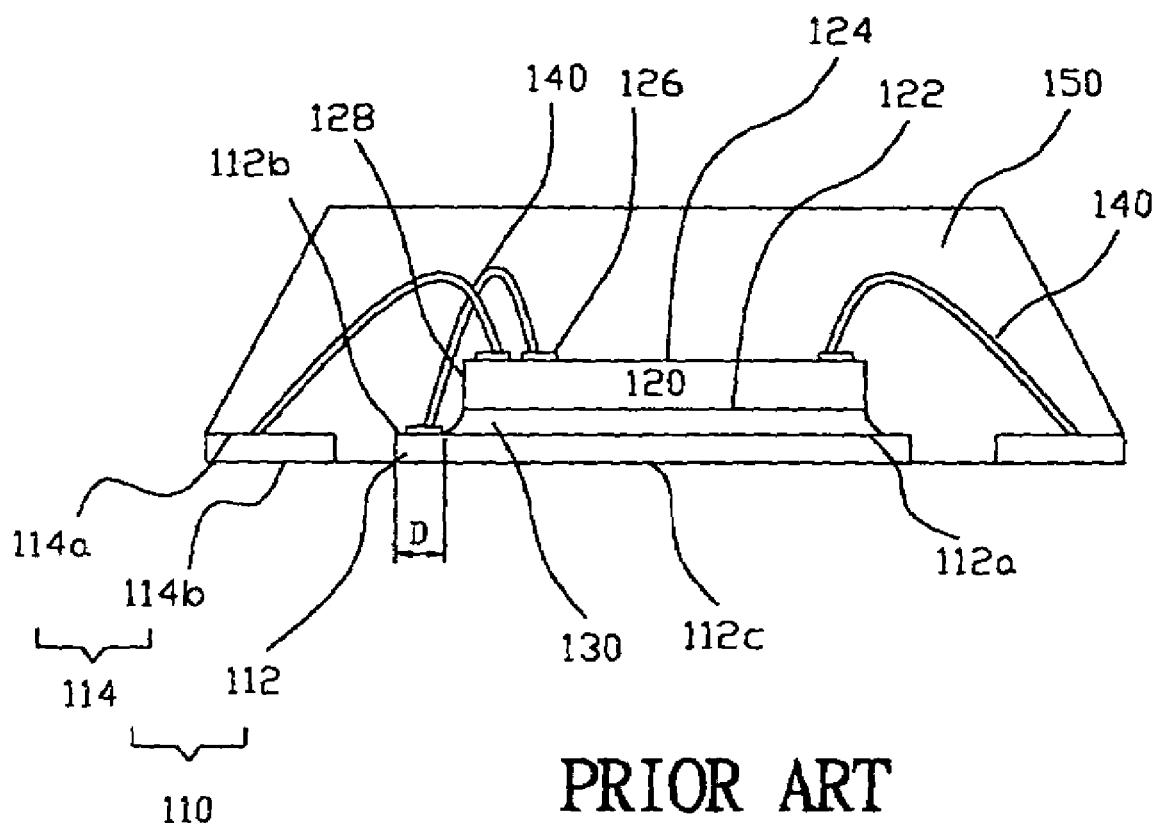
FIG. 1 is a cross-sectional view of the conventional leadless semiconductor package.
Figure 2:
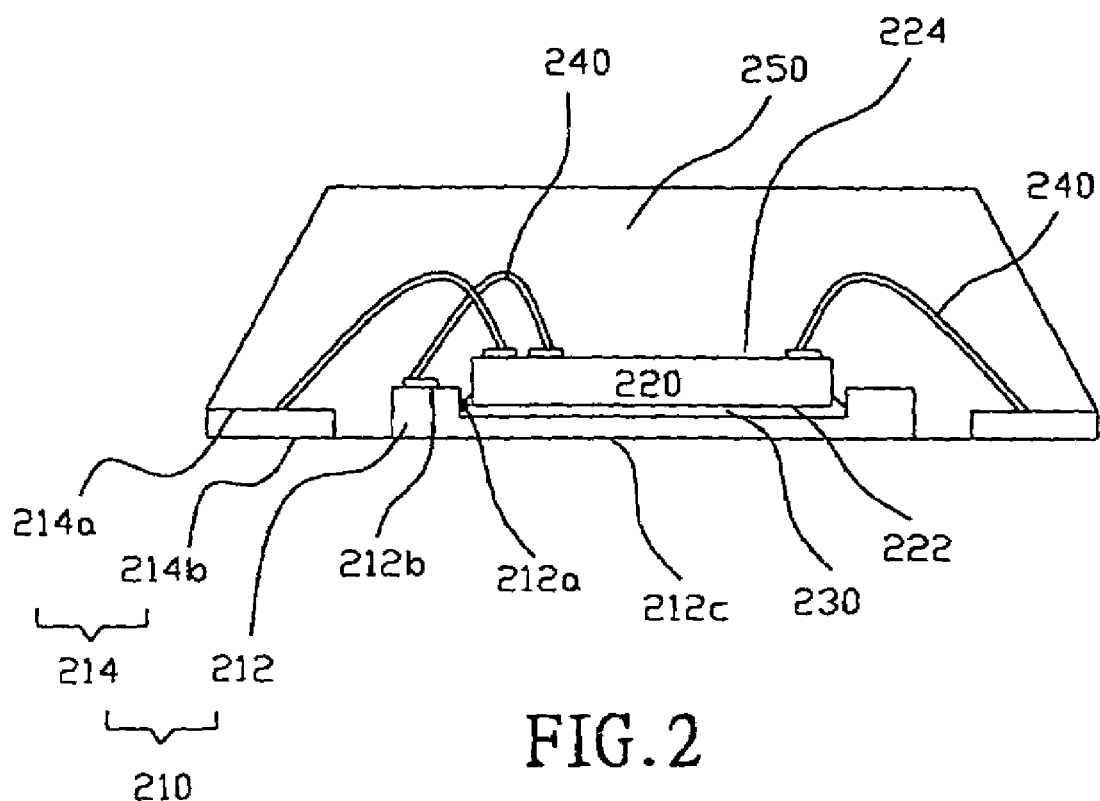
FIG. 2 is a cross-sectional view of a leadless semiconductor package according to the first embodiment of the present invention.

In accordance with a first preferred embodiment as shown in FIG. 2, there is provided a leadless semiconductor package. The leadless semiconductor package mainly comprises a lead frame 210, a chip 220, an adhesive 230 (such as a silver paste or a liquid adhesive) and a plurality of electrically conductive wires 240. Herein, the lead frame 210, such as a leadless lead-frame, has a chip paddle 212 and a plurality of leads 214 surrounding the chip paddle 212. Moreover, the chip paddle 212 has a cavity 212a formed therein and a grounding area 212b surrounding the cavity 212a. The chip 220 has a back surface 222 and an active surface 224, and the chip 220 is placed in the cavity 212a of the chip paddle 212 through the adhesive 230. Herein, the back surface 222 of the chip 220 is attached to the cavity 212a of the chip paddle 212. In addition, the active surface 224 of the chip 220 are electrically bonded to the grounding area 212b and the leads 214 by the electrically conductive wires 240 respectively. Furthermore, an encapsulation 250, such as molding compound, is provided to encapsulate the chip 220, the electrically conductive wires 240, the cavity 212a and the grounding area 212b of the chip paddle 212 and the top 214a of the lead 214. The bottom 214b of each lead 214 and the bottom 212c of the chip paddle 212 are exposed to form electrical terminals for connecting to external electronic devices. To be noted, in order to enhance the attachment of the electrically conductive wires 240 to the grounding area 212b and the leads 214, there is generally a metal layer, such as a silver metal layer, formed thereon.

Figure 3:
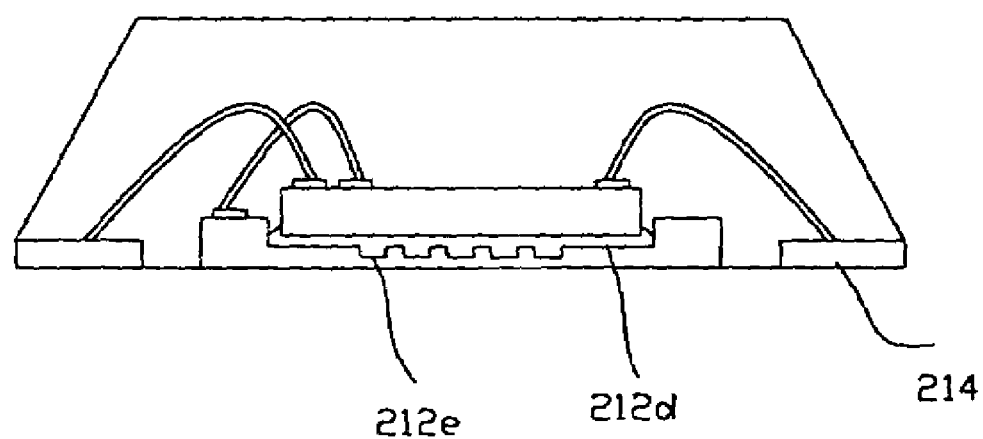
FIG. 3 is a cross-sectional view of a leadless semiconductor package according to the second and third embodiments of the present invention.
Figure 4:
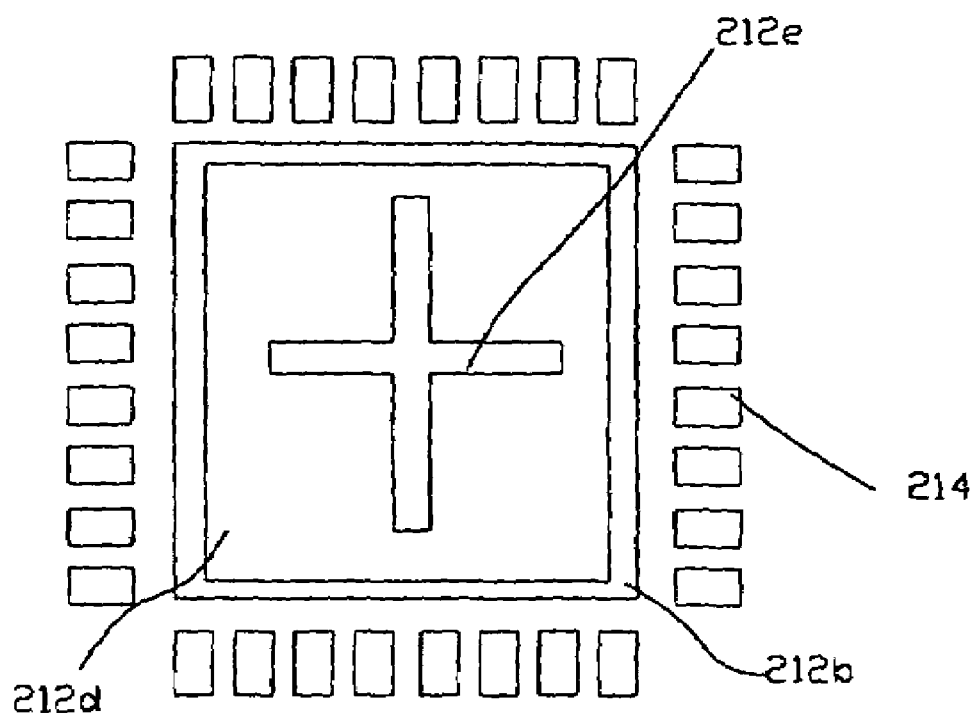
FIG. 4 is a top view of the cavity formed in the chip paddle of the lead frame according to the second embodiment of FIG. 3.
Figure 5:
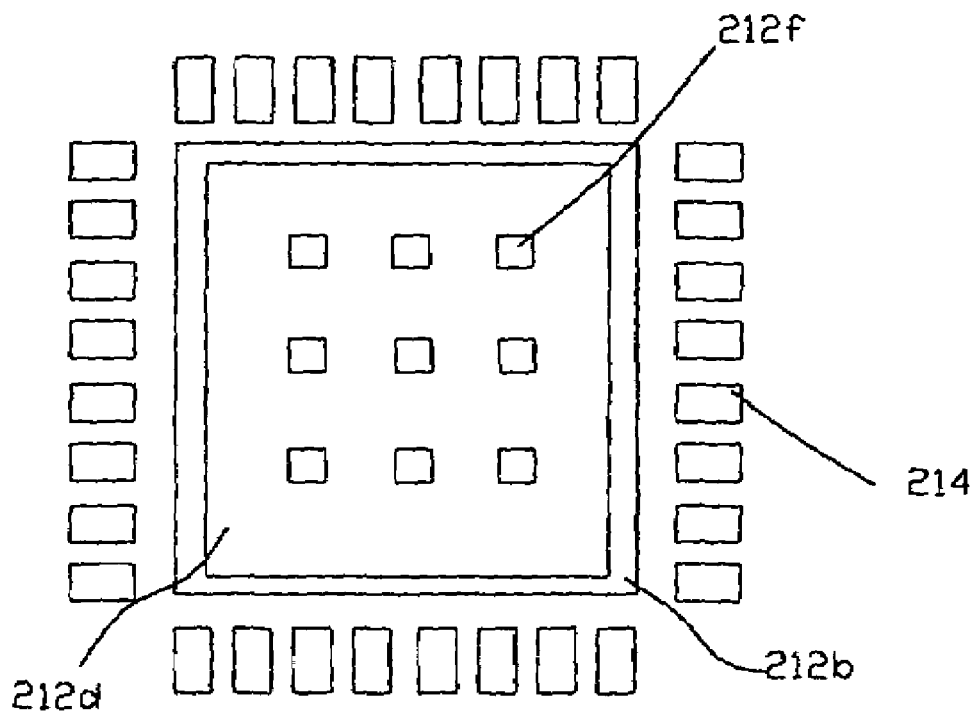
FIG. 5 is a top view of the concavity formed in the chip paddle of the lead frame according to the third embodiment of FIG. 3.
Figure 6:
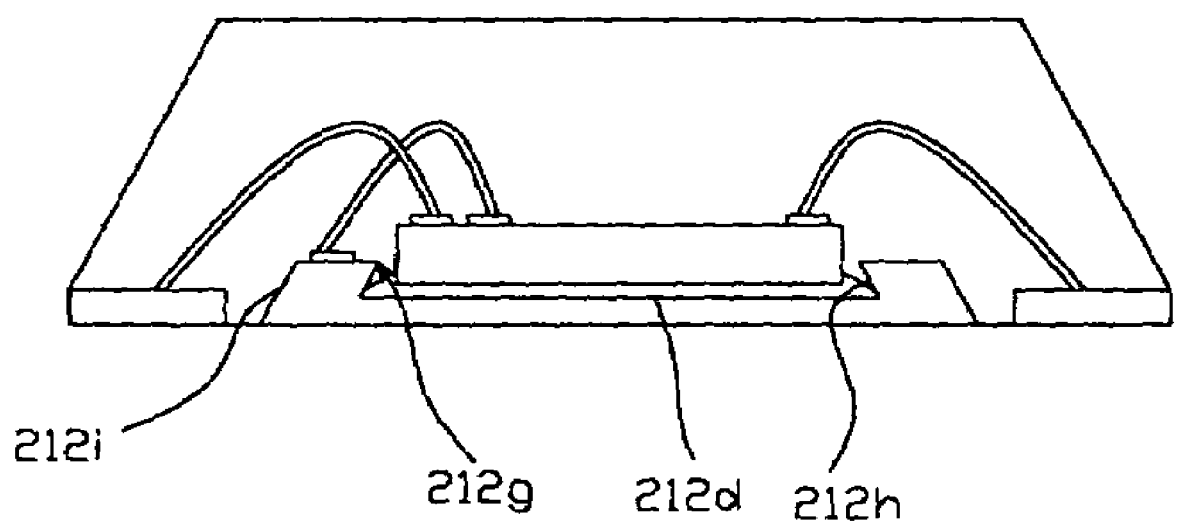
FIG. 6 is a cross-sectional view of a leadless semiconductor package according to the fourth and third embodiments of the present invention.

Furthermore, as shown in FIG. 3, FIG. 4 and FIG. 5, a slot 212e (as shown in FIG. 3 and FIG. 4) or at least a concavity 212f (as shown in FIG. 3 and FIG. 5) is formed at the bottom 212d of the cavity 212a to accommodate more adhesive 230, so as to prevent the exceeding adhesive flowing over the grounding area 212b. In such a manner, not only more adhesive could be accommodated in the cavity 212a but also the contact area of the adhesive 230 with the cavity 212a could be increased, so as to enhance the attachment between the chip 220 and the chip paddle 212. To be noted, the slot 212e and concavity 212f can be formed by the method of punching and half-etching. Moreover, as mentioned above, when there are a plurality of concavities 212f are formed, the concavities 212f can be arranged in an area array. Further, when there are a plurality of slots 212e are formed, the slots 212e can be shaped into a cross-like slot. Besides, as shown in FIG. 6 illustrating the forth embodiment, when the cavity 212a is formed, the etching mask and the etching time can be well chosen and controlled to form a cavity with an opening 212g smaller than the bottom 212d of the cavity 212a. Namely, the side wall 212h of the cavity 212a can be designed as a skew or slant side wall to form an angle between the side wall 212h and the bottom 212d of the cavity 212 which is smaller than 90 degree to enhance the attachment between the encapsulation 250 and the lead frame 210. In addition, the outer wall 212i of the chip paddle 210 can be skew or slant to enhance the attachment between the encapsulation 250 and the lead frame 210.

Figure 7:
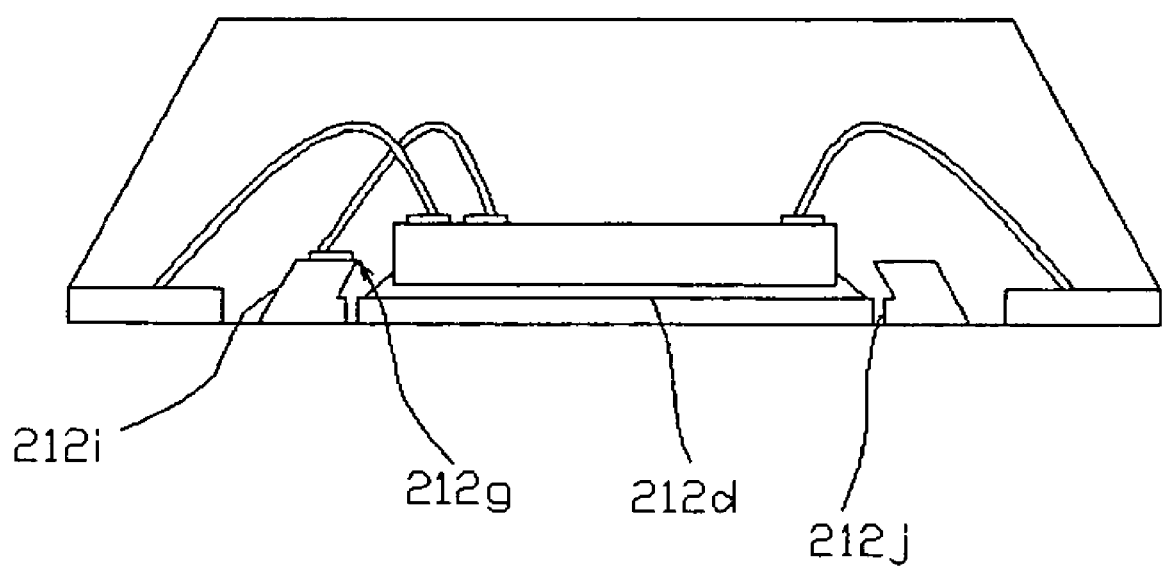
FIG. 7 is a cross-sectional view of a leadless semiconductor package according to the fifth embodiments of the present invention.

Furthermore, as shown in FIG. 7 illustrating the fifth embodiment, when the chip paddle 212 is etched, at least a through hole 212j is formed on the bottom 212d of the cavity 212a. Therefore, the effect of cleaning the etchant after etching can be increased. And, the problem of remaining the etchant in the cavity 212a can also be prevented. In this embodiment, the through hole 212j is positioned around the adhesive 230, so as to prevent the adhesive 230 outflowing and enhance the attachment between the encapsulation 250 and the lead frame 210.

As mentioned above, the depth of the cavity 212a is usually about half of the thickness of the chip paddle 212. Because the chip 220 is placed in the cavity 212a through the adhesive 230, which is disposed in the cavity 212a and the grounding area 212b of the chip paddle 212 is protruded from the cavity 212a and disposed around the cavity 212a, the adhesive 230 could be well controlled in the cavity 212a to prevent flowing into the grounding area 212b. In such a manner, the chip 220 will be well bonded to the grounding area 212b by the electrically conductive wires 240. In addition, because the chip 220 is placed in the cavity 212a of the chip paddle 212, the top of the electrically conductive wires 240 connected with the chip 220 and the lead frame 210 will be lowered to shorten the length of the electrically conductive wires 240 and to lower the impedance of the electrically conductive wires 240. Accordingly, the electrical performance will be enhanced. Besides, the chip 220 is placed in the cavity 212b so that the total thickness of the package will become smaller. Accordingly, there is a thinner leadless semiconductor package provided.

Although the invention has been described in considerable detail with reference to certain preferred embodiments, it will be appreciated and understood that various changes and modifications may be made without departing from the spirit and scope of the invention as defined in the appended claims.

What is claimed is:

1. A leadless semiconductor package, comprising:
   a lead frame, said lead frame having a chip paddle, a plurality of leads surrounding said chip paddle wherein the chip paddle has a cavity and a grounding area surrounding the cavity, the cavity has an opening, a bottom and a through hole, the bottom is larger than the opening in size;

an adhesive disposed in the cavity;

a chip, said chip having an active surface and a back surface opposed to the active surface, and said back surface disposed in the cavity and attached to the lead frame through the adhesive;

a plurality of first electrically conductive wires electrically connecting the leads and the chip; and a plurality of second electrically conductive wires electrically connecting the grounding area and the chip.

2. The leadless semiconductor package of claim 1, wherein said cavity further has a slot formed therein.

3. The leadless semiconductor package of claim 1, wherein said cavity further has a concavity formed therein.

4. The leadless semiconductor package of claim 1, wherein the depth of the cavity is at least greater than half of the thickness of the chip paddle.

5. The leadless semiconductor package of claim 1, wherein the depth of the cavity is equal to half of the thickness of the chip paddle.

6. The leadless semiconductor package of claim 1, further comprising:

an encapsulation encapsulating the chip, the first electrically conductive wires, the second electrically conductive wires and a portion of the lead frame.

7. The leadless semiconductor package of claim 1, wherein the adhesive comprises a silver paste.

8. The leadless semiconductor package of claim 1, wherein the first electrically conductive wires or the second electrically conductive wires comprises a gold wire.

9. A leadless lead-frame, comprising:

a chip paddle having a cavity and a grounding area surrounding the cavity, wherein the cavity further has a through hole, an opening, a bottom and a slot formed in the cavity, the bottom is larger than the opening in size; and a plurality of leads surrounding said chip paddle.

10. The leadless lead-frame of claim 9, wherein the cavity further has a concavity formed therein.

11. The leadless lead-frame of claim 9, wherein the cavity further has a side wall and the side wall is slant.

12. The leadless lead-frame of claim 9, wherein the depth of the cavity is at least greater than half of the thickness of the chip paddle.

13. The leadless lead-frame of claim 9, wherein the depth of the cavity is equal to half of the thickness of the chip paddle.

14. The leadless lead-frame of claim 9, wherein the cavity further has a plurality of concavities formed therein and the concavities are arranged in an area array.

15. The leadless lead-frame of claim 9, wherein the cavity further has a slot with a cross-like shape formed therein.

16. The leadless lead-frame of claim 9, further comprising a metal layer formed on the grounding area.

17. The leadless lead-frame of claim 9, wherein each of the leads has a top and the top has a metal layer formed thereon.

18. The leadless lead-frame of claim 17, wherein the metal layer is a silver metal layer.

19. The leadless lead-frame of claim 9, wherein the chip paddle has a slant outer wall.

* * * * *